(12) United States Patent
Do (10) Patent No.: US 12,439,739 B2
(45) Date of Patent: Oct. 7, 2025

(54) MICRO-NANOFIN LED ELEMENT AND METHOD FOR PRODUCING SAME

(71) Applicant: KOOKMIN UNIVERSITY INDUSTRY ACADEMY COOPERATION FOUNDATION, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 383 days.

(21) Appl. No.: 17/997,265

(22) PCT Filed: Apr. 27, 2021

(86) PCT No.: PCT/KR2021/005309
§ 371 (c)(1),
(2) Date: Oct. 27, 2022

(87) PCT Pub. No.: WO2021/221437
PCT Pub. Date: Nov. 4, 2021

(65) Prior Publication Data
US 2023/0223492 A1    Jul. 13, 2023

(30) Foreign Application Priority Data

Apr. 27, 2020 (KR) .................. 10-2020-0050884
Apr. 28, 2020 (KR) .................. 10-2020-0051422

(51) Int. Cl.
*H10H 20/819*    (2025.01)
*H10H 20/01*    (2025.01)
(Continued)

(52) U.S. Cl.
CPC ...... *H10H 20/819* (2025.01); *H10H 20/0137* (2025.01); *H10H 20/018* (2025.01);
(Continued)

(58) Field of Classification Search
CPC ............ H10H 20/819; H10H 20/0137; H10H 20/018; H10H 20/825; H10H 20/83; H10H 20/032; H10H 20/01
See application file for complete search history.

(56) References Cited

U.S. PATENT DOCUMENTS 7,476,910 B2 *  1/2009  Fujimoto ............... H10H 20/82
                                                      257/E33.068
7,867,885 B2 *  1/2011  Bae ..................... H10H 20/819
                                                      257/571
(Continued)

FOREIGN PATENT DOCUMENTS

KR    20090028068    3/2009
KR    20110040676    4/2011
(Continued)

OTHER PUBLICATIONS

International Search Report and Written Opinion issued in Corresponding PCT Application No. PCT/KR2021/005309, dated Aug. 26, 2021 (English translation provided).

*Primary Examiner* — Dao H Nguyen
(74) *Attorney, Agent, or Firm* — NORTON ROSE FULBRIGHT US LLP (57) ABSTRACT

The present invention relates to an LED element, more particularly, to a micro-nanofin LED element and a method for manufacturing the same.

15 Claims, 6 Drawing Sheets

(51) Int. Cl.
    *H10H 20/825*     (2025.01)
    *H10H 20/83*     (2025.01)

(52) U.S. Cl.
    CPC .......... *H10H 20/825* (2025.01); *H10H 20/83* (2025.01); *H10H 20/032* (2025.01)

(56) References Cited

U.S. PATENT DOCUMENTS

| | | | |
|---|---|---|---|
| 11,251,166 B2* | 2/2022 | Schuele | A61K 40/4272 |
| 2010/0127238 A1* | 5/2010 | Kim | H10H 20/841 |
| | | | 977/773 |
| 2013/0113005 A1* | 5/2013 | Lee | H10H 29/0362 |
| | | | 257/E33.068 |
| 2016/0211245 A1* | 7/2016 | Do | H10H 20/84 |
| 2022/0399475 A1* | 12/2022 | Khan | H10H 20/811 |
| 2023/0253442 A1* | 8/2023 | Kim | H05K 5/10 |
| | | | 257/79 |

FOREIGN PATENT DOCUMENTS

| | | |
|---|---|---|
| KR | 20120122159 | 11/2012 |
| KR | 101436123 | 11/2014 |
| KR | 101490758 | 2/2015 |
| KR | 20160059576 | 5/2016 |
| KR | 20200029100 | 3/2020 |

\* cited by examiner

MICRO-NANOFIN LED ELEMENT AND METHOD FOR PRODUCING SAME

CROSS-REFERENCE TO RELATED APPLICATION

This application is a national phase application under 35 U.S.C. § 371 of International Application No. PCT/KR2021/005309, filed Apr. 27, 2021, which claims priority to and the benefit of Korean Application No. 10-2020-0050884, filed Apr. 27, 2020, and Korean Application No. 10-2020-0051422, filed Apr. 28, 2020. The contents of the referenced patent applications are incorporated into the present application by reference.

TECHNICAL FIELD

The present invention relates to an LED element, and more particularly, to a micro-nanofin LED element and a manufacturing method thereof.

DESCRIPTION OF RELATED ART

Micro-LEDs and nano-LEDs may implement an excellent feeling of color and high efficiency and may be eco-friendly materials, thereby being used as core materials for displays. In line with such market conditions, recently, research for developing new nanorod LED structures or shell-coated nano-cable LEDs through new manufacturing processes is being carried. In addition, research on a protective film material is being carried out to achieve high efficiency and high stability of a protective film covering an outer surface of nanorods, and research and development of a ligand material advantageous for a subsequent process is also being carried out.

Recently, large-sized red, green, and blue micro-LED display TVs have been commercialized in line with research in such material fields, and in the future, TVs, which implement full-color through blue subpixels implemented using blue micro-LEDs or nano-LEDs and red and green subpixels implemented using quantum dots emission through the blue LEDs, will be commercialized. In addition, red, green, and blue nano-LED display TVs will also be commercialized.

Micro-LED displays have advantages such as high performance characteristics, very long theoretical lifetime, and very high efficiency, but when micro-LED displays are developed as displays with 8K resolution, a red micro-LED, a green micro-LED, and a blue micro-LED should be put in one-to-one correspondence with each of nearly 100 million subpixels. Thus, through pick and place technology for manufacturing micro-LED displays, it is difficult to manufacture true high-resolution commercial displays ranging from smartphones to TVs due to the limitations of process technology, considering a high unit price, a high process defect rate, and low productivity. In addition, it is more difficult to individually arrange nano-LEDs on subpixels using pick and place technology for micro-LEDs.

In order to overcome such difficulty, Korean Patent Registered No. 10-1436123 discloses a display manufactured through a method of dropping a solution mixed with nanorod-type LEDs on subpixels and then forming an electric field between two alignment electrodes to self-align nanorod-type LED elements on the electrodes and form the subpixels. However, there are problems in that a large number of LEDs must be mounted in order to express desired efficiency because the efficiency is not good due to the small area from which light is extracted, and there is the high possibility of unavoidable defects occurring in the nanorod-type LED itself.

Specifically, a method is known in which a nanopatterning process in combination with dry etching/wet etching are performed on an LED wafer to manufacture nanorod-type LED elements in a top-down manner, or nanorod-type LED elements are grown directly on a substrate in a bottom-up manner. In such nanorod-type LEDs, since a major axis of an LED coincides with a stack direction, that is, a stack direction of each layer in a p-GaN/InGaN multi-quantum well (MQW)/n-GaN stacked structure, an emission area is narrow. Since the emission area is narrow, surface defects have a relatively large effect on a degradation in efficiency, and it is difficult to optimize an electron-hole recombination rate, which may cause a problem in that luminous efficiency is significantly lower than that of an original wafer.

Therefore, there is an urgent need to develop a new LED material that has a wide emission area, minimizes or prevents a degradation in efficiency due to surface defects, has an optimized electron-hole recombination rate, and has excellent luminous efficiency and high luminance, as well as easily arranging an element using an electric field.

SUMMARY

The present invention is devised to solve the above problems, and an object of the present invention is to provide a micro-nanofin LED element and a method for manufacturing the same, which maintain high efficiency and have high luminance by increasing an emission area.

Another object of the present invention is to provide a micro-nanofin LED element and a method for manufacturing the same, which can prevent a degradation in efficiency due to surface defects by reducing the thickness of a photoactive layer exposed on a surface while increasing an emission area.

In addition, still another object of the present invention is to provide a micro-nanofin LED element and a method for manufacturing the same, which can minimize a degradation in electron-hole recombination efficiency due to non-uniformity of electron and hole velocities and a degradation in luminous efficiency resulting therefrom.

Furthermore, it is another object to provide a micro-nanofin LED element and a method for manufacturing the same, which are very suitable for a method of self-aligning the element on an electrode by an electric field.

In order to achieve the above object, the present invention provides a method for manufacturing a micro-nanofin LED element, comprising the steps of (1) preparing an LED wafer in which a first conductive semiconductor layer, a photoactive layer, and a second conductive semiconductor layer are sequentially stacked, (2) forming an electrode layer or a polarization inducing layer patterned so that regions having different electrical polarities are adjacent to each other on the second conductive semiconductor layer of the LED wafer, (3) forming a plurality of micro-nanofin LED structures by etching the LED wafer in a thickness direction so that each element has a plane having a length and width of nano or micro size in which a thickness perpendicular to the plane is smaller than the length, and (4) separating the plurality of micro-nanofin LED structures from the LED wafer.

According to an embodiment of the present invention, the polarization inducing layer in the step (2) may be formed by including the steps of 2-1) forming a first polarization inducing layer on the second conductive semiconductor layer, 2-2) etching the first polarization inducing layer in the thickness direction along a predetermined pattern, and 2-3) forming a second polarization inducing layer on an etched intaglio portion.

In addition, the step (3) may include the steps of 3-1) forming a mask pattern layer on an upper surface of the electrode layer or the polarization inducing layer so that each element has a planar shape having a length and width of nano or micro size, 3-2) forming the plurality of micro-nanofin LED structures by etching the first conductive semiconductor layer to a partial thickness in the thickness direction along a pattern of the mask pattern layer, 3-3) forming an insulating film to cover an exposed side surface of each of the plurality of micro-nanofin LED structures, 3-4) removing a portion of the insulting film formed on the upper portion of the first conductive semiconductor layer to expose an upper surface of the first conductive semiconductor layer between the adjacent micro-nanofin LED structures while not removing the insulating film covering side surfaces of the plurality of micro-nanofin LED structures, 3-5) forming the plurality of micro-nanofin LED structures in which a side portion of the first conductive semiconductor layer is exposed by further etching an exposed upper portion of the first conductive semiconductor layer in the thickness direction, 3-6) etching the first conductive semiconductor layer exposed in each of the micro-nanofin LED structures from both side surfaces in a width direction to a center, and 3-7) removing the mask pattern layer disposed on the upper portion of the electrode layer or the polarization inducing layer and the insulating film covering the side surface.

In addition, the method may further include, between the steps (3) and (4), the step of (5) forming a protective film on the side surfaces of the plurality of micro-nanofin LED structures.

In addition, a lower surface of the first conductive semiconductor layer of the micro-nanofin LED element separated in the step (4) may have a protrusion having a predetermined width and thickness formed in a longitudinal direction of the element.

In addition, the present invention provides a micro-nanofin LED element which is a rod-type element having a plane having a length and width of nano or micro size in which a thickness perpendicular to the plan is smaller than the length, and in which a first conductive semiconductor layer, a photoactive layer, a second conductive semiconductor layer, and an electrode layer or a polarization inducing layer are sequentially stacked in a thickness direction.

According to an embodiment of the present invention, the polarization inducing layer is configured so that electrical polarities of both ends of the element in a longitudinal direction are different from each other.

In addition, the length may be 1000 to 10000 nm, and the thickness may be 100 to 3000 nm.

In addition, the width may be greater or equal to the thickness.

In addition, a ratio of the length and thickness of the element may be 3:1 or more.

In addition, the polarization inducing layer may include a first polarization inducing layer and a second polarization inducing layer that are disposed adjacent to each other in a longitudinal direction of the element and have different electrical polarities from each other. In this case, as an example, the first polarization inducing layer may be ITO, and the second polarization inducing layer may be a metal or semiconductor.

In addition, the micro-nanofin LED element may further include a protective film formed on the side surface of the element to cover the exposed surface of the photoactive layer.

In addition, an emission area of the micro-nanofin LED element exceeds twice an area of a vertical cross-section of the micro-nanofin LED element.

In addition, the micro-nanofin LED element may be for use in an electric field array assembly in which the LED element is self-aligned on an electrode through an electric field induction arrangement.

In addition, one of the first conductive semiconductor layer and the second conductive semiconductor layer may include a p-type GaN semiconductor layer, and the other may include an n-type GaN semiconductor layer, the p-type GaN semiconductor layer may have a thickness of 10 to 350 nm, and the n-type GaN semiconductor layer may have a thickness of 1000 to 3000 nm, and a thickness of the photoactive layer may have a thickness of 30 to 200 nm.

In addition, a lower surface of the first conductive semiconductor layer of the micro-nanofin LED element may have a protrusion having a predetermined width and thickness formed in a longitudinal direction of the element.

In addition, a width of the protrusion may be formed to be 50% or less compared to the width of the micro-nanofin LED element.

Hereinafter, the terms used in the present invention will be defined.

In descriptions of embodiments of the present invention, it should be understood that when a layer, region, pattern, or structure is referred to as being "on," "upper", "above," "under," "lower", "below" a substrate another layer, another region, or another pattern, the terminology of "on," "upper", "above," "under," "lower", "below" includes both the meanings of "directly" and "indirectly".

A micro-nanofin LED element according to the present invention is advantageous to achieve high luminance and light efficiency by increasing an emission area compared to the conventional rod-type LED element. In addition, while increasing the emission area, the area of the photoactive layer exposed to the surface is greatly reduced, thereby preventing or minimizing the degradation in efficiency due to surface defects. Furthermore, it is possible to minimize the degradation in the electron-hole recombination efficiency due to the non-uniformity of the electron and hole velocities and the resulting degradation in the luminous efficiency, and it is very suitable for the method of self-aligning the element on the electrode by an electric field, so it is be widely applied as a material for displays and various light sources.

DETAILED DESCRIPTION OF THE INVENTION

Hereinafter, embodiments of the present invention will be described in detail with reference to the accompanying drawings such that those skilled in the art to which the present invention can easily carry out the present invention. It should be understood that the present invention may be embodied in various different forms and is not limited to the following embodiments.

Referring to FIGS. 1 to 6, assuming that based on the mutually perpendicular x, y, and z axes, the x-axis direction is the length, the y-axis direction is the width, and the z-axis direction is the thickness, a micro-nanofin LED element 100, 100' is a rod-type element in which the length is a major axis, the thickness is a minor axis, and the length is greater than the thickness, and is an element in which a first conductive semiconductor layer 10, a photoactive layer 20, a second conductive semiconductor layer 30, and an electrode layer 40 or a polarization inducing layer 40' are sequentially stacked in the thickness direction.

More particularly, the micro-nanofin LED element 100, 100' has a predetermined shape in the x-y plane consisting of a length and a width in which the direction perpendicular to the plane becomes the thickness direction, and the respective layers for constituting LED element are stacked in the thickness direction. The micro-nanofin LED element 100, 100' having such a structure has an advantage of securing a wider emission area due to a plane consisting of a length and a width even if the thickness of the photoactive layer 20 in the portion exposed to the side surface is thin. In addition, due to this, the emission area of the micro-nanofin LED element 100, 100' according to an embodiment of the present invention may have a wide emission area exceeding twice the area of the longitudinal cross-section of the micro-nanofin LED element. Here, the longitudinal cross-section is a cross-section parallel to the X-axis direction, which is the longitudinal direction, and in the case of an element having a constant width, it may be the x-y plane.

Figure 7A:
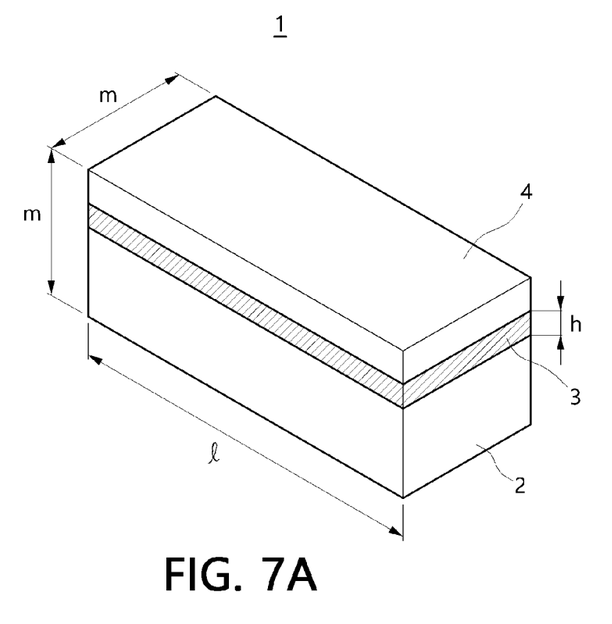
FIGS. 7A and 7B are a schematic view of a first rod-type element in which a first conductive semiconductor layer, a photoactive layer, and a second conductive semiconductor layer are stacked in a thickness direction, and a schematic view of a second rod-type element in which a first conductive semiconductor layer, a photoactive layer, and a second conductive semiconductor layer are stacked in a longitudinal direction, respectively.
Figure 7B:
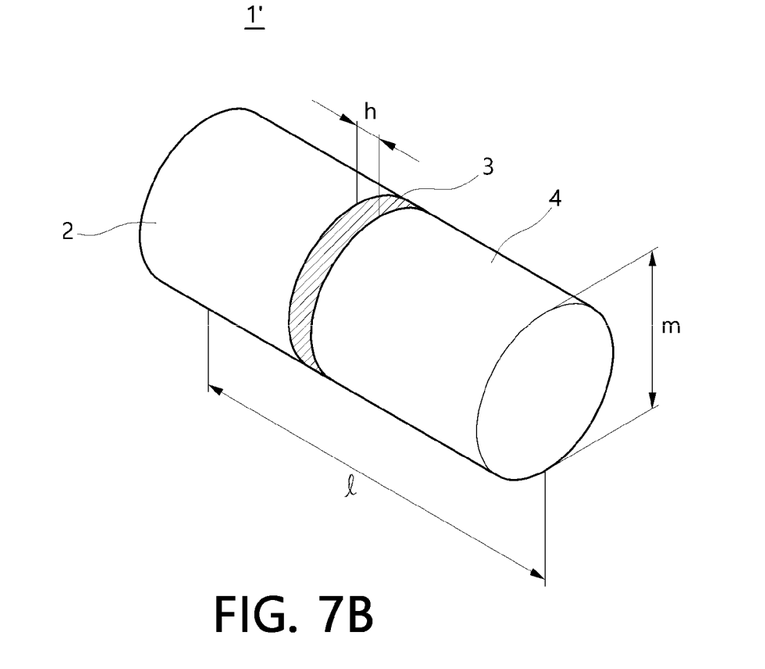

Specifically, when describing by comparing FIGS. 7a and 7b, a first rod-type element 1 illustrated in FIG. 7a and a second rod-type element 1' illustrated in FIG. 7b both have a structure in which a first conductive semiconductor layer 2, a photoactive layer 3, and a second conductive semiconductor layer 4 are stacked, and are rod-type elements in which the length (($\ell$)) and the thickness (m) are the same, and the thickness (h) of the photoactive layer is also the same. However, in the first rod-type element 1, the first conductive semiconductor layer 2, the photoactive layer 3, and the second conductive semiconductor layer 4 are stacked in the thickness direction, while in the second rod-type element 1' structurally different from the first rod-type element 1, each layer is stacked in the longitudinal direction.

The two elements 1, 1' have a large difference in the emission area. Assuming that, for example, the length (($\ell$)) is 4000 nm, the thickness (m) is 600 nm, and the thickness (h) of the photoactive layer 3 is 100 nm, the ratio of the surface area (which corresponds the emission area) of the photoactive layer 3 of the first rod-type element 1 and the surface area of the photoactive layer 3 of the second rod-type element 1' is 6.42 $\mu m^2$:0.6597 $\mu m^2$. Thus, the emission area of the first rod-type element 1, which is a micro-nanofin LED element, is 9.84 times larger. In addition, for the ratio of the surface area of the photoactive layer 3 exposed to the outside in the emission area of the total photoactive layer, the first rod-type element 1 is similar to the second rod-type element 1', but since the increased absolute value of the unexposed surface area of the photoactive layer 3 is much larger, the effect of the exposed surface area on the excitons is much reduced. Thus, since the first rod-type element 1, which is the micro-nanofin LED element, has a much smaller effect of surface defects on excitons compared to the second rod-type element 1', which is a horizontally arranged rod-type element. Therefore, it can be evaluated that the first rod-type element 1, which is the micro-nanofin LED element, is significantly superior to the second rod-type element 1', which is the horizontally arranged rod-type element, in terms of luminous efficiency and luminance. In addition, in the case of the second rod-type element 1', a wafer on which a conductive semiconductor layer and a photoactive layer are stacked in the thickness direction is etched in the thickness direction. As a result, a long length of the element corresponds to the wafer thickness. In order to increase the length of the element, an increase in the etched depth is unavoidable. The greater the etch depth, the higher the possibility of defects on the element surface. As a result, even if the area of the exposed photoactive layer is small compared to the first rod-type element 1, the second rod-type element 1' has a higher possibility of surface defects. Thus, considering that the luminous efficiency decreases due to the increase in the possibility of surface defects, it may be expected that the first rod-type element 1 can be significantly superior in luminous efficiency and luminance.

Furthermore, a movement distance of the holes injected from any one of the first conductive semiconductor layer 2 and the second conductive semiconductor layer 4 and the electrons injected from the other one in the first rod-type element 1 is shorter than the movement distance in the second rod-type element 1', so that the probability of electrons and/or holes being captured by defects on the wall during electron and/or hole movement is reduced, thereby minimizing emission loss, and advantageously minimizing emission loss due to electron-hole velocity imbalance. In addition, in the case of the second rod-type element 1', a strong optical path behavior occurs due to the circular rod-type structure, so the path of the light generated by electron-holes resonates in the longitudinal direction, so that light is emitted from both ends in the longitudinal direction, and thus, a front luminous efficiency is not suitable due to the strong side luminous profile when the elements are arranged to be placed lying down. On the other hand, in the case of the first rod-type element 1, light is emitted from the upper and lower surfaces, so excellent front luminous efficiency is expressed.

The micro-nanofin LED element 100, 100' of the present invention is implemented so that the conductive semiconductor layers 10 and 30 and the photoactive layer 20 are staked in the thickness direction and the length is longer than the thickness, as in the above-described first rod-type element 1, thereby having a more improved emission area. Furthermore, even if the area of the exposed photoactive layer 20 is slightly increased, since it is the rod-type in which the thickness is smaller than the length, the etched depth is shallow, the possibility of occurrence of defects on the exposed surface of the photoactive layer 20 can be reduced, and it is advantageous to minimize or prevent a degradation in luminous efficiency due to defects.

Figure 1:
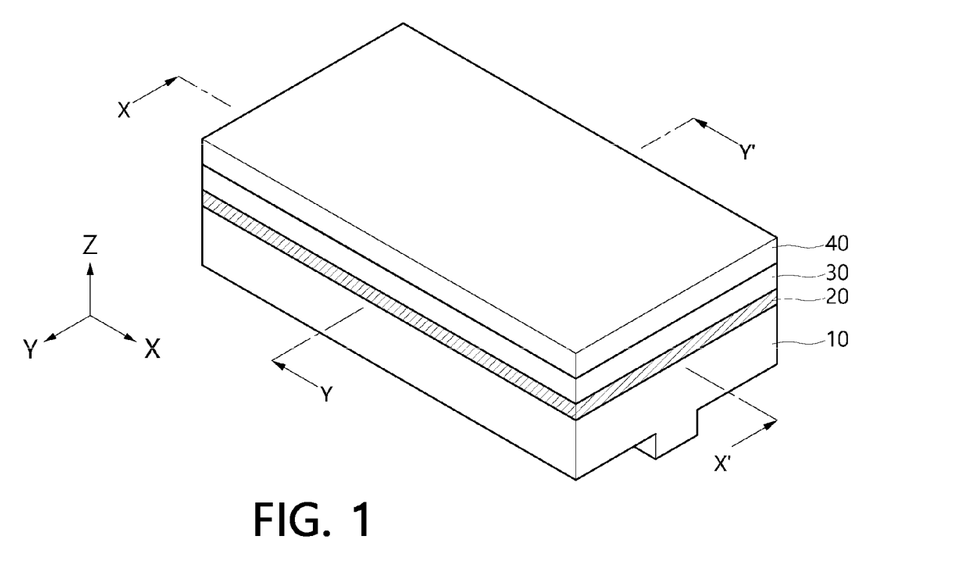
FIGS. 1 to 3 are a perspective view of a micro-nanofin LED element according to an embodiment of the present invention, a cross-sectional view taken along the boundary line X-X', and a cross-sectional view taken along the boundary line Y-Y'.

Although the plane is illustrated as a rectangle in FIG. 1, it is not limited thereto, and it is noted that the shape can be employed without limitation, from general rectangular shapes such as rhombus, parallelogram, trapezoid, etc. to oval, etc.

The micro-nanofin LED element 100, 100' according to an embodiment of the present invention has a size of micro or nano units in length and width. For example, the micro-nanofin LED element 100, 100' may have a length of 1000 to 10000 nm, and a width of 250 to 1500 nm. In addition, the thickness may be 100 to 3000 nm. The standard of the length and width may be different depending on the shape of the plane. For example, when the plane is a rhombus or a parallelogram, one of the two diagonals may be the length and the other may be the width, and in the case of a trapezoid, the longest of the height, upper and lower side surfaces may be the length, and the shorter one perpendicular to the longer one may be the width. Alternatively, when the shape of the plane is an ellipse, the major axis of the ellipse may be the length and the minor axis may be the width.

In this case, a ratio of the length and thickness of the micro-nanofin LED element 100, 100' may be 3:1 or more, more preferably 6:1 or more, and thus the length may be greater than the thickness, and through this, there is the advantage in that the element can be self-aligned more easily on the electrode through an electric field. If the ratio of the length and thickness of the micro-nanofin LED element 100, 100' is reduced to less than 3:1, it may be difficult to self-align the element on the electrode through an electric field, and the element is not fixed on the electrode. There is a possibility that an electrical contact short circuit caused by a defect. However, the ratio of the length and the thickness may be 15:1 or less, and through this, it may be advantageous to achieve the object of the present invention, such as optimization of a rotation torque that is self-alignment through an electric field.

In addition, the width of the micro-nanofin LED element 100, 100' may be greater than or equal to the thickness, through this, when the micro-nanofin LED element 100, 100' is aligned on two different electrodes by using an electric field, there is an advantage of minimizing or preventing alignment by lying on the side surface. If the micro-nanofin LED element is aligned on its side surface, even if alignment and mounting are achieved in which one end and the other end contact the two different electrodes, respectively, there is a problem of not being to perform its original function because light may not be emitted due to an electrical short circuit that occurs as the photoactive layer exposed on the side surface of the element comes into contact, which may reduce display luminance or generate defective pixels.

In addition, the micro-nanofin LED element 100, 100' may be an element having different sizes at both ends in the longitudinal direction, for example, a rod-type element having a rectangular plane of an equilateral trapezoid whose length, i.e., height is greater than the upper and lower side surfaces. Depending on the length difference between the upper side surface and the lower side surface, a difference between positive and negative charges accumulated at both ends of the element in the longitudinal direction may occur as a result, which may make the self-alignment through an electric field easier.

In addition, the lower surface of the first conductive semiconductor layer 10 of the micro-nanofin LED element 100, 100' includes a protrusion 11 that may be formed in the longitudinal direction of the element while having a predetermined width and thickness. Although the protrusion 11 will be described in detail in the description of the manufacturing method to be described later, the protrusion may be formed as a result of horizontally etching inward from both side surfaces of the lower end of the etched LED portion in order to remove the etched LED portion from a wafer after etching the wafer in the thickness direction. The protrusion 11 may help to perform an improvement function for the extraction of the front emission of the micro-nanofin LED element 100, 100'. In addition, when the micro-nanofin LED element 100, 100' is self-aligned on an electrode, the protrusion 11 may help to control the alignment such that the opposite surface opposite to the one surface of the element on which the protrusion 11 is formed is positioned on the electrode. Furthermore, after the opposite surface is positioned on the electrode, the electrode may be formed on one surface of the element where the protrusion 11 is formed for emission of the element, the protrusion 11 may be advantageous in improving the mechanical coupling force between the electrode and the micro-nanofin LED element 100, 100' as the contact area between the formed electrode and the protrusion 11 increases.

In this case, the width of the protrusion 11 may be formed to be 50% or less, more preferably, 30% or less of the width of the micro-nanofin LED element 100, 100', so that the separation of the etched portion of the micro-nanofin LED element on the LED wafer can be made easier. If the protrusion is formed exceeding 50% of the width of the micro-nanofin LED element 100, 100', it may not be easy to separate the etched portion of the micro-nanofin LED element on the LED wafer. In addition, the cutting, separation on unintended portions may be occurred, which may cause a degradation in mass productivity and/or quality, and there is a concern that the length and quality uniformity of the micro-nanofin LED elements produced in large numbers may be deteriorated. Meanwhile, the width of the protrusion 11 may be formed to be 10% or more of the width of the micro-nanofin LED element 100, 100'. If the width of the protrusion is formed to be less than 10% of the width of the micro-nanofin LED element 100, 100', the separation on the LED wafer may be easy, but during side etching (see FIG. 8($g$)/FIG. 8($i$)), FIG. 9($h$)/FIG. 9($j$)) to be described later, due to excessive etching, there is a risk that even a portion of the first conductive semiconductor layer that should not be etched may be etched, and the effect according to the above-described protrusion 11 may not be expressed. In addition, there is a risk of separation by the wet etching solution, and there is a problem in that the micro-nanofin LED element 100 dispersed in the high-risk etching solution having a strong basic property has to be separated from the wet etching solution for cleaning. On the other hand, the thickness of the protrusion 11 may have a thickness of 10 to 30% of the thickness of the first conductive semiconductor layer, through which the first conductive semiconductor layer can be formed to a desired thickness and quality, which may be more advantageous to express the effect through the protrusion 11. Here, the thickness of the first conductive semiconductor layer refers to a thickness based on the lower surface of the first conductive semiconductor layer on which the protrusion is not formed.

As a specific example, the width of the protrusion 11 may be 50 to 300 nm, and the thickness may be 50 to 400 nm.

Hereinafter, each layer included in the micro-nanofin LED elements 100, 100' will be described.

The micro-nanofin LED elements 100, 100' includes a first conductive semiconductor layer 10 and a second conductive semiconductor layer 30. A conductive semiconductor layer included in a typical LED element used for a light, a display, and the like may be used as the used conductive semiconductor layer without limitation, According to a preferred embodiment of the present invention, any one of the first conductive semiconductor layer 10 and the second conductive semiconductor layer 30 may include at least one n-type semiconductor layer, and the other conductive semiconductor layer may include at least one p-type semiconductor.

When the first conductive semiconductor layer 10 includes an n-type semiconductor layer, the n-type semiconductor layer may include a semiconductor material having an empirical formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, InGaN, AN, InN, and the like and may be doped with a first conductive dopant (for example, Si, Ge, Sn, etc.). According to one preferred embodiment of the present invention, the first conductive semiconductor layer 10 may have a thickness of 1 to 3 μm, but the present invention is not limited thereto.

When the second conductive semiconductor layer 30 includes a p-type semiconductor layer, the p-type semiconductor layer may include a semiconductor material having an empirical formula of $In_xAl_yGa_{1-x-y}N$ ($0 \leq x \leq 1$, $0 \leq y \leq 1$, and $0 \leq x+y \leq 1$), for example, at least one selected from among InAlGaN, GaN, AlGaN, InGaN, AlN, InN, and the like, and may be doped with a second conductive dopant (for example, Mg). According to one preferred embodiment of the present invention, the second conductive semiconductor layer 30 may have a thickness of 0.01 to 0.30 μm, but the present invention is not limited thereto.

Figure 4:
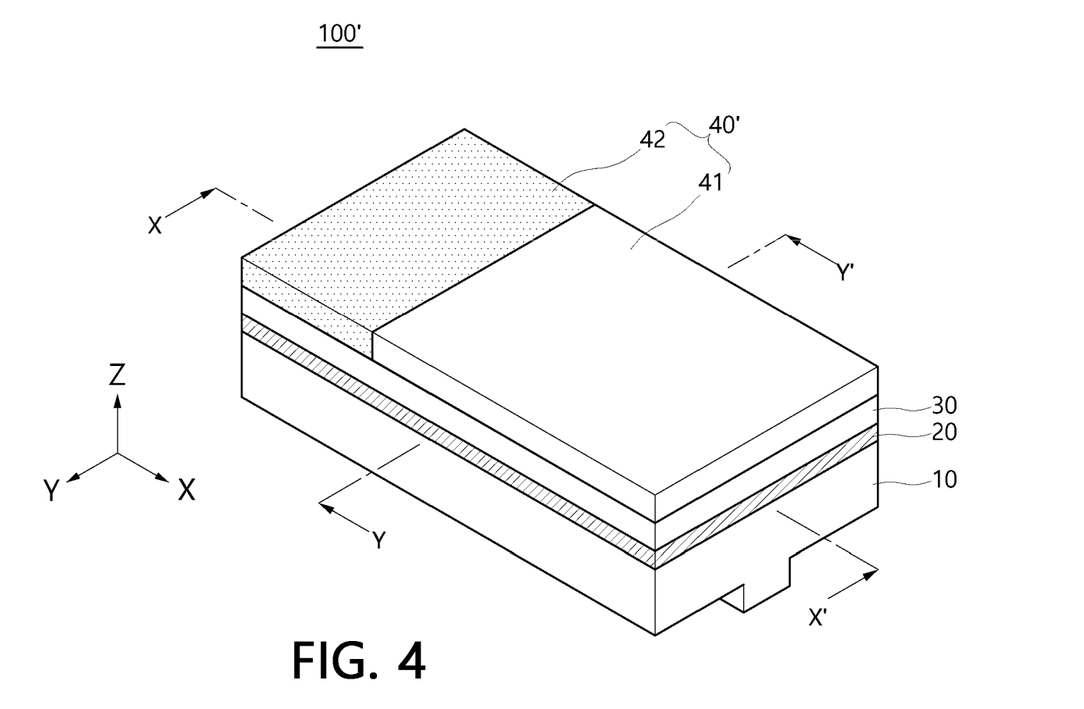
FIGS. 4 to 6 are a perspective view of a micro-nanofin LED element according to another embodiment of the present invention, a cross-sectional view taken along the boundary line X-X', and a cross-sectional view taken along the boundary line Y-Y'.

According to an embodiment of the present invention, one of the first conductive semiconductor layer 10 and the second conductive semiconductor layer 30 includes a p-type GaN semiconductor layer, and the other includes an n-type GaN semiconductor layer, and the p-type GaN semiconductor layer may have a thickness of 10 to 350 nm, and the n-type GaN semiconductor layer may have a thickness of 1000 to 3000 nm, through which the movement distance of the holes injected into the p-type GaN semiconductor layer and the electrons inserted into the n-type GaN semiconductor layer is shorter compared to the rod-type element in which the semiconductor layer and the photoactive layer are stacked in the longitudinal direction as illustrated in FIG. 4b. Through this, the probability of electrons and/or holes being captured by defects on the wall during movement is reduced, thereby minimizing emission loss, and it may be advantageous to minimize emission loss due to electron-hole velocity imbalance.

Next, the photoactive layer 20 is formed on the first conductive semiconductor layer 10 and may be formed to have a single or multi-quantum well structure. A photoactive layer included in a typical LED element used for a light, a display, and the like may be used as the photoactive layer 20 without limitation. A clad layer (not shown) doped with a conductive dopant may be formed on and/or below the photoactive layer 20, and the clad layer doped with the conductive dopant may be implemented as an AlGaN layer Of an InAlGaN layer. In addition, a material such as AlGaN or AlInGaN may be used for the photoactive layer 20. In the photoactive layer 20, when an electric field is applied to an element, electrons and holes moving from the conductive semiconductor layers positioned on and below the photoactive layer to the photoactive layer are combined to generate electron-hole pairs in the photoactive layer, thereby emitting light. According to one preferred embodiment of the present invention, the photoactive layer 20 may have a thickness of 30 to 300 nm, but the present invention is not limited thereto.

Figure 2:
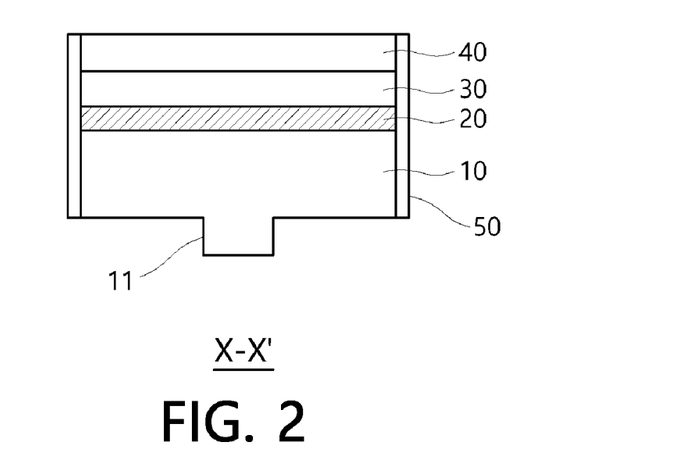
Figure 3:
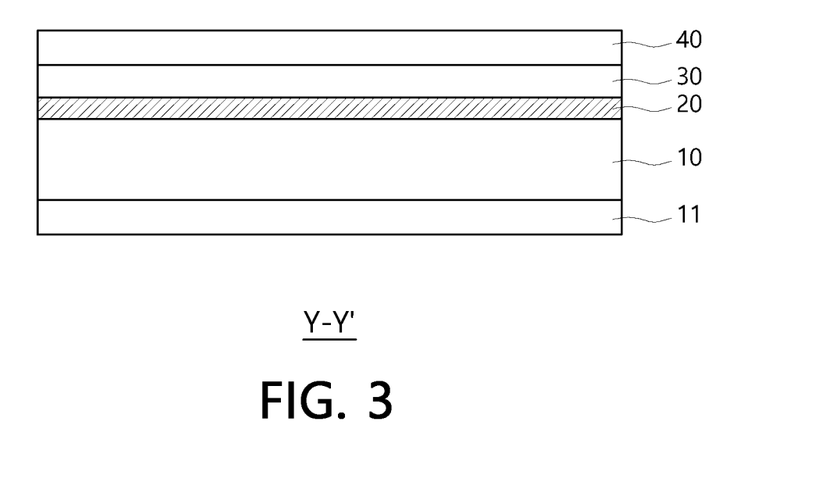
Figure 5:
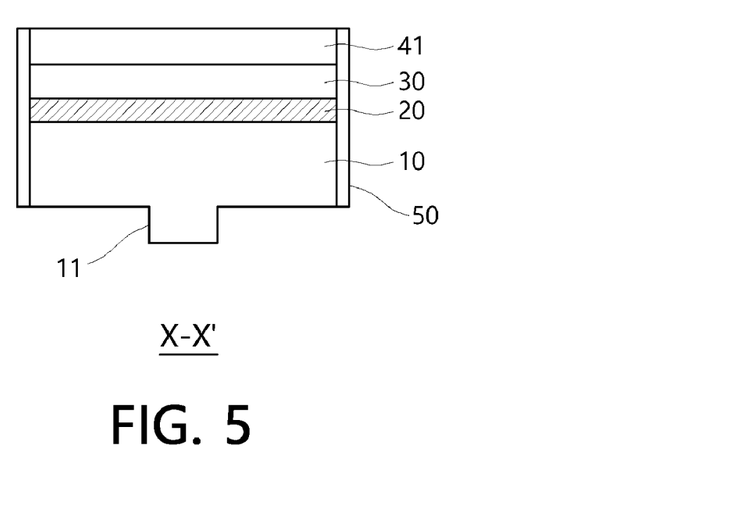
Figure 6:
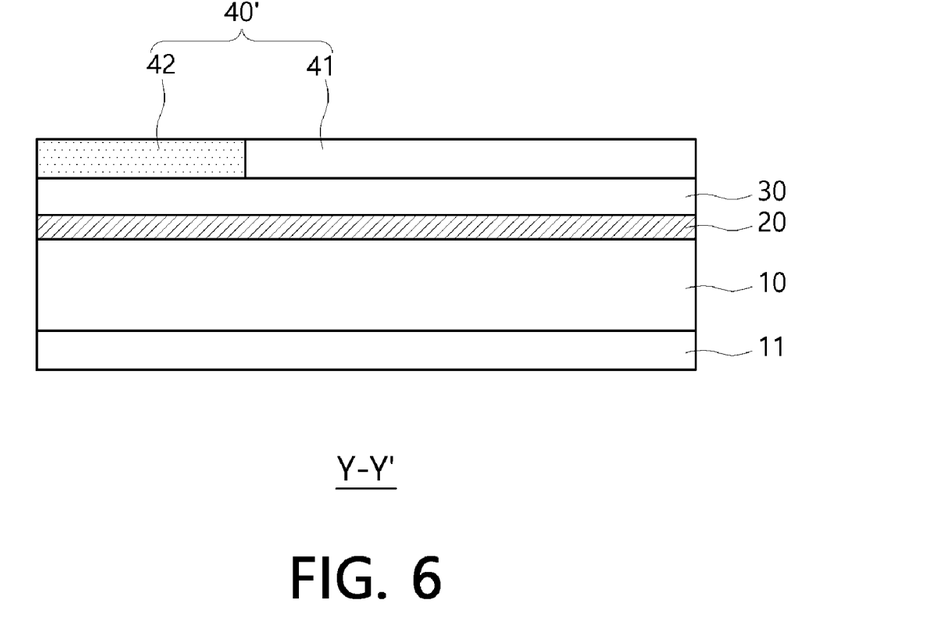

Next, on the second conductive semiconductor layer 30 described above, an electrode layer 40 may be formed as illustrated in FIGS. 1 to 3 or a polarization inducing layer 40' may be formed as illustrated in FIGS. 4 to 6.

First, the case in which the electrode layer 40 is formed will be described. An electrode layer included in a typical LED element used for a light, a display, and the like may be used as the electrode layer 40 without limitation. The electrode layer 40 may be made of Cr, Ti, Al, Au, Ni, ITO, and an oxide or alloy thereof alone or in combination, but the electrode layer 40 may be preferably a transparent material in order to minimize emission loss. An example may be the ITO. In addition, the thickness of the electrode layer 40 may be 50 to 500 nm, but is not limited thereto.

In addition, the polarization inducing layer 40' is a layer that facilitates self-alignment by an electric field by allowing both ends thereof to have different electrical polarities in the longitudinal direction of the micro-nanofin LED element 100', and at the same time, may increases conductivity and function as an electrode layer when a material such as a metal is used. The polarization inducing layer 40' may have the first polarization inducing layer 41 disposed on one end in the longitudinal direction of the element, and the second polarization inducing layer 42 disposed on the other end in the longitudinal direction of the element, and in this case, the first polarization inducing layer 41 and the second polarization inducing layer 42 may have different electrical polarities. For example, the first polarization inducing layer 41 may be ITO, and the second polarization inducing layer 42 may be a metal or a semiconductor. In addition, the thickness of the polarization inducing layer 40' may be 50 to 500 nm, but is not limited thereto. The first polarization inducing layer 41 and the second polarization inducing layer 42 may be disposed in the same area by dividing the upper surface of the second conductive semiconductor layer 30 in two, but is not limited thereto. Either one of the first polarization inducing layer 41 and the second polarization inducing layer 42 may be disposed to have a larger area.

The above-described first conductive semiconductor layer 10, photoactive layer 20, second conductive semiconductor layer 30, and electrode layer 40 or polarization inducing layer 40' may be included as the minimum components of the micro-nanofin LED element 100, 100', and other phosphor layers, active layers, semiconductor layers, hole block layers, and/or electrode layers above and below each layer may be further included.

Meanwhile, according to an embodiment of the present invention, a protective film 50 formed on the side surface of the micro-nanofin LED element 108 to cover the exposed surface of the photoactive layer 20 may be further included. The protective film 50 is a film for protecting the exposed surface of the photoactive layer 20, and covers at least all the exposed surface of the photoactive layer 20, for example, both side surfaces, front end, and rear end of the micro-nanofin LED element 108. The protective film 50 may include at least one from among silicon nitride ($Si_3N_4$), silicon dioxide ($SiO_2$) aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN), more preferably the material made of the above component, or may be transparent, but is not limited thereto. According to a preferred embodiment of the present invention, the thickness of the protective film may be 5 to 100 nm, but is not limited thereto.

The above-described micro-nanofin LED element 100 and 100' according to an embodiment of the present invention may be suitable for use in an electric field array assembly in which the LED elements are self-aligned on an electrode through an electric field induction arrangement. The electric field array assembly is an assembly implemented by a method of arranging the element on an electrode using an electric field formed by using a voltage at the electrode, and for a detailed description thereof, the contents of Korean Patent Registration Nos. 10-1490758, 10-1436123 by the inventor of the present invention are incorporated herein by reference.

The above-described micro-nanofin LED element 100 and 100' may be manufactured by a manufacturing method described below, but is not limited thereto.

Figure 8:
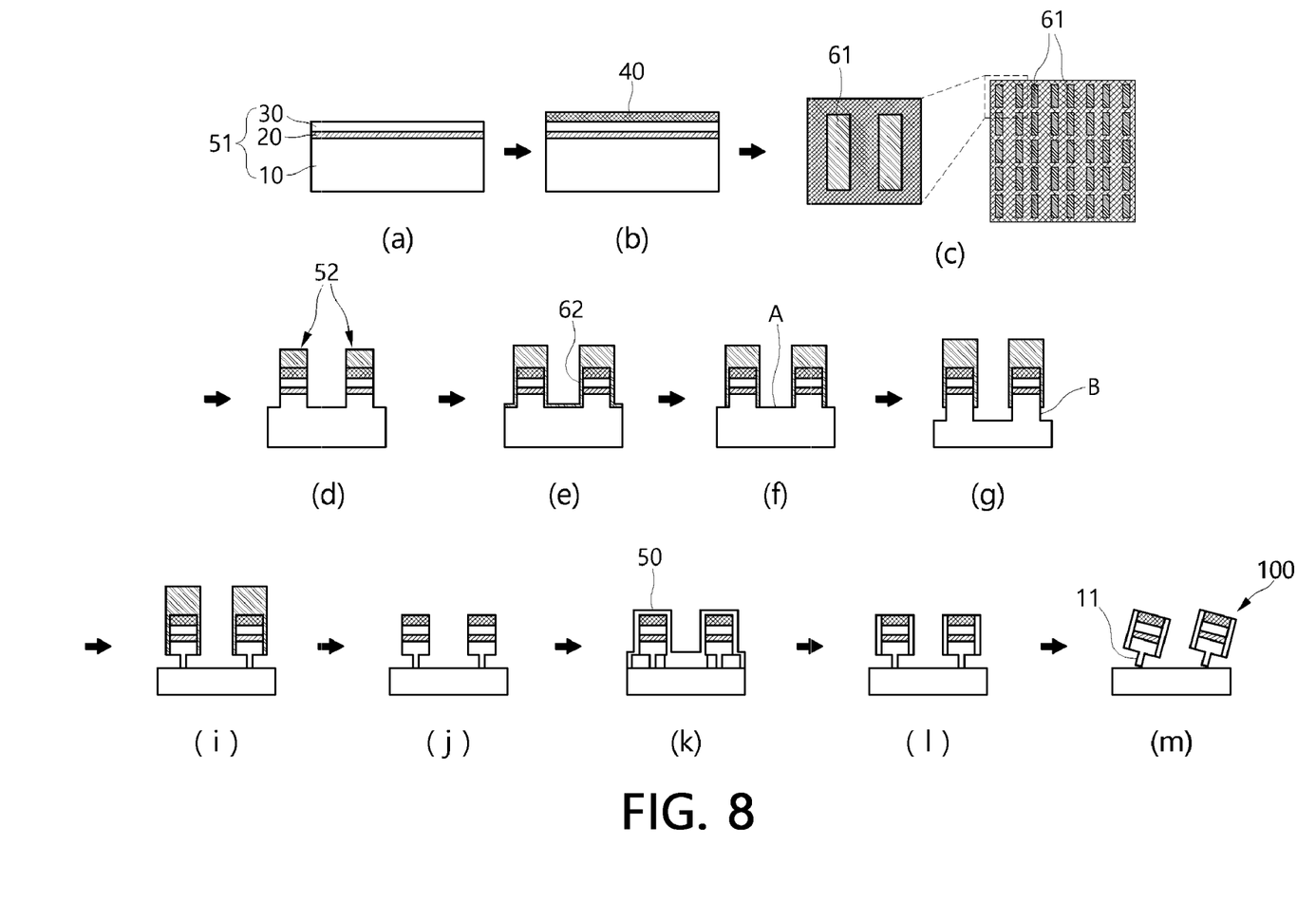
FIGS. 8 and 9 are schematic views of a method for manufacturing a micro-nanofin LED element according to various embodiments of the present invention.
Figure 9:
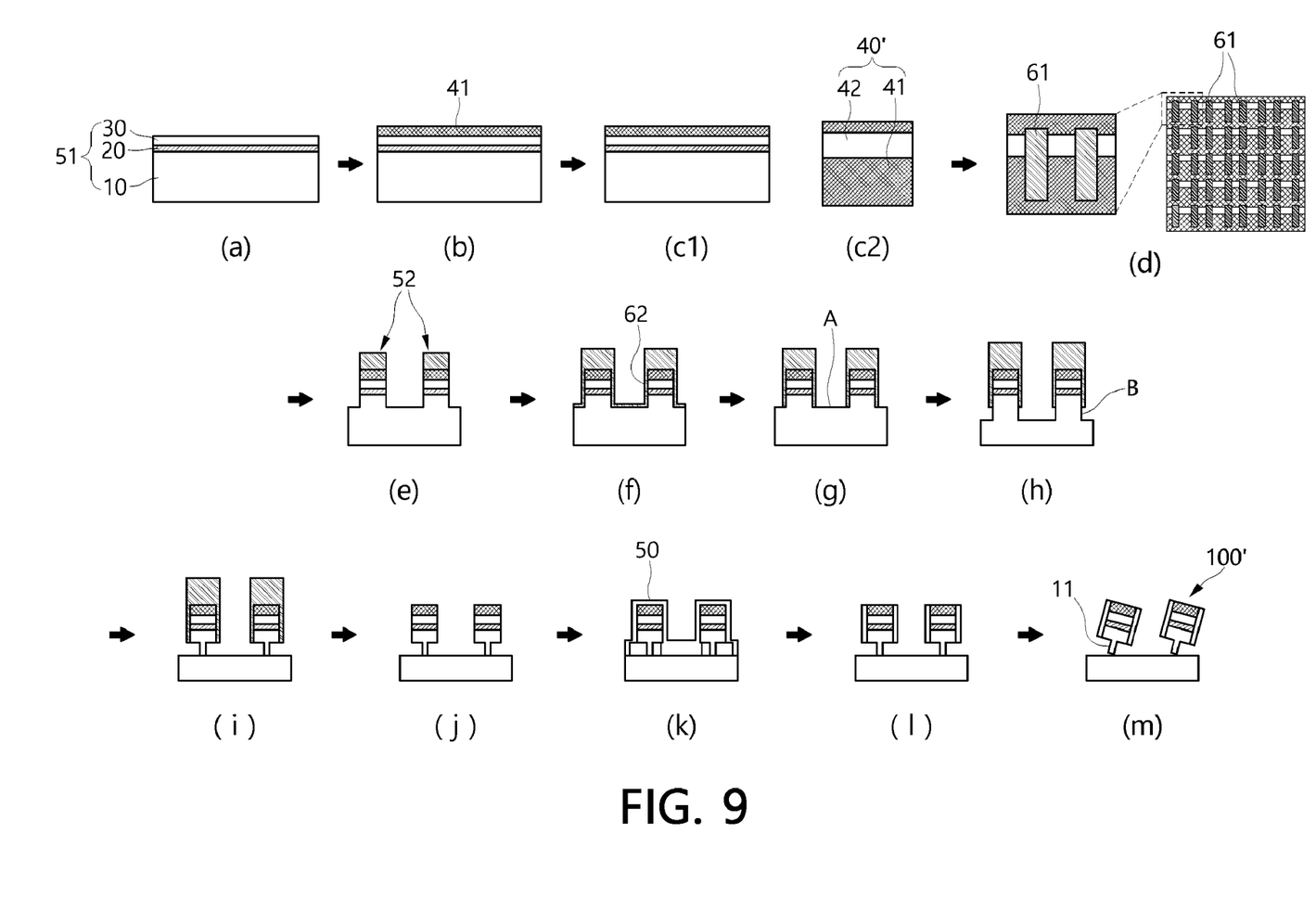

Referring to FIGS. 8 and 9, the micro-nanofin LED element 100, 100' may be manufactured by including steps of (1) preparing an LED wafer 51 in which the first conductive semiconductor layer 10, the photoactive layer 20, and the second conductive semiconductor layer 30 are sequentially stacked, (2) forming the electrode layer 40 or the polarization inducing layer 40' patterned so that the regions having different electrical polarities are adjacent to each other on the second conductive semiconductor layer 30 of the LED wafer 51, (3) forming a plurality of micro-nanofin LED structures 52 by etching the LED wafer 51 in the thickness direction so that each element has a plane having a length and width of nano or micro size in which the thickness perpendicular to the plane is smaller than the length, and (4) separating the plurality of micro-nanofin LED structures 52 from the LED wafer 51.

Referring to FIG. 8, a method for manufacturing the micro-nanofin LED element 100 in which the electrode layer 40 is formed on the second conductive semiconductor layer 30 will be described. As step (1) of the present invention, the step of preparing the LED wafer 51 in which the first conductive semiconductor layer 10, the photoactive layer 20 and the second conductive semiconductor layer 30 are sequentially stacked on a substrate (not shown) is performed.

Since the description of each layer provided in the LED wafer 51 is the same as that described above, a detailed description thereof will be omitted, and the description will be mainly made with reference to parts not described.

First, the thickness of the first conductive semiconductor layer 10 in the LED wafer 51 may be thicker than the thickness of the first conductive semiconductor layer 10 in the above-described micro-nanofin LED element 100. In addition, each layer in the LED wafer 51 may have a c-plane crystal structure.

The LED wafer 51 may be subjected to a cleaning process, and since a cleaning process and cleaning solution of a typical wafer may be appropriately applied in the cleaning process, the present invention is not particularly limited thereto. The cleaning solution may be, for example, isopropyl alcohol, acetone, and hydrochloric acid but is not limited thereto.

Next, as step (2), as illustrated in FIG. 8(*b*), the step of forming the electrode layer 40 on the second conductive semiconductor layer 30 of the LED wafer 51 may be performed. The first electrode layer 40 may be formed through a typical method of forming an electrode on a semiconductor layer and may be formed by, for example, deposition through sputtering. The material of the first electrode layer 40 may be, for example, ITO as described above, and the first electrode layer 40 may be formed to have a thickness of about 150 nm. The first electrode layer 40 may be further subjected to a rapid thermal annealing process after a deposition process. As an example, the first electrode layer 40 may be processed at a temperature of 600° C. for 10 minutes. However, since the rapid thermal annealing process may be appropriately adjusted in consideration of the thickness, material, etc. of the electrode layer, the present invention is not particularly limited thereto.

Next, as step (3) of the present invention, the step of forming the plurality of micro-nanofin LED structures 52 by etching the LED wafer 52 in the thickness direction so that each element has a plane having a length and width of nano or micro size in which the thickness perpendicular to the plane is smaller than the length is performed.

Specifically, step (3) may be performed by including the steps of 3-1) forming a mask pattern layer 61 on the upper surface of the electrode layer 40 so that each element is a plane having a predetermined shape having a length and width of nano or micro size (FIG. 8(*c*)), 3-2) forming the plurality of micro-nanofin LED structures 52 by etching the first conductive semiconductor layer 10 to a partial thickness in the thickness direction along the pattern of the mask pattern layer 61 (FIG. 8(*d*)), 3-3) forming an insulating film 62 to cover the exposed side surface of each of the plurality of micro-nanofin LED structures 52 (FIG. 8(*e*)), 3-4) removing a portion of the insulting film 62 formed on the upper portion of the first conductive semiconductor layer 10 to expose the upper surface (A in FIG. 8(*f*)) of the first conductive semiconductor layer 10 between the adjacent micro-nanofin LED structures 52 while not removing the insulating film covering the side surfaces of the plurality of micro-nanofin LED structures 52 (FIG. 8(*f*)), 3-5) forming the plurality of micro-nanofin LED structures in which the side portion (B in FIG. 8(*g*)) of the first conductive semiconductor layer is exposed by further etching the exposed upper portion (A in FIG. 8(*f*)) of the first conductive semiconductor layer 10 in the thickness direction (FIG. 8(*g*)), 3-6) etching the first conductive semiconductor layer 10 exposed in each of the micro-nanofin LED structures from both side surfaces in the width direction to a center (FIGS. 8(*i*)), and 3-7) removing the mask pattern layer 61 disposed on the upper portion of the electrode layer 40 and the insulating film 62 covering the side surface (FIG. 8(*j*)).

First, as step 3-1), the step of forming the mask pattern layer 61 on the upper surface of the electrode layer 40 so that each element is a plane having a predetermined shape having a length and width of nano or micro size (FIG. 8 (c)) may be performed.

The mask pattern layer 61 is a layer patterned to have a desired planar shape of the LED element to be implemented, and may be formed of a known method and material used for etching an LED wafer. The mask pattern layer 61 may be, for example, a SiO$_2$ hard mask pattern layer. Briefly, the SiO$_2$ hard mask pattern layer may be formed by a method of forming an un-patterned SiO$_2$ hard mask layer on the electrode layer 40, forming a metal layer on the SiO$_2$ hard mask layer, forming a predetermined pattern on the metal layer, etching the metal layer and the SiO$_2$ hard mask layer in the thickness direction along the pattern , and removing the metal layer.

The mask layer is a layer from which the mask pattern layer 61 is derived. For example, SiO$_2$ may be formed through deposition. The mask layer may have a thickness of 0.5 to 3 μm, for example, 1.2 μm. In addition, the metal layer may be, for example, an aluminum layer, and the aluminum layer may be formed through deposition. The predetermined pattern formed on the formed metal layer is for realizing the pattern of the mask pattern layer, and may be a pattern formed by a typical method. For example, the pattern may be formed through photolithography using a photosensitive material or may be a pattern formed through a known nanoimprinting method, laser interference lithography, electron beam lithography, or the like. Thereafter, the step of etching the metal layer and the SiO$_2$ hard mask layer along the formed pattern is performed. For example, the metal layer may be etched using an inductively coupled plasma (ICP), the SiO$_2$ hard mask layer or the imprinted polymer layer may be etched using dry etching method such as a reactive ion etching (RIE).

Next, the step of removing the metal layer or other photosensitive material layer remained on the upper portion of the etched SiO$_2$ hard mask layer, or the remaining polymer layer according to the imprint method may be performed. The removal may be performed through a typical wet etching or dry etching method depending on the material, and detailed description thereof will be omitted in the present invention.

FIG. 8 (c) illustrates a plan view of the SiO$_2$ hard mask layer 61 patterned on the electrode layer 40, and then, as illustrated in FIG. 8 (d), step 3-2) of forming the plurality of micro-nanofin LED structures 52 by etching the first conductive semiconductor layer 10 to a partial thickness in the thickness direction of the LED wafer 51 along the pattern may be performed. The etching may be performed through a typical dry etching method such as ICP.

Thereafter, as step 3-3), the step of forming the insulating film 62 to cover the exposed side surface of the micro-nanofin LED structure 52 may be performed, as illustrated in FIG. 8(e). The insulating film 62 coated on the side surface may be formed through deposition, and the material thereof may be, for example, SiO$_2$, but is not limited thereto. The insulating film 62 functions as a side mask layer, and specifically, in the process of etching the side portion (B in FIG. 8(g)) of the first conductive semiconductor layer 10 to separate the micro-nanofin LED structure 52 as illustrated in FIG. 8(i), the insulating film 62 prevents the portion to be the first semiconductor layer 10 of the micro-nanofin LED element 100 from being etched, and functions to prevent damage due to the etching process. The insulating film 62 may have a thickness of 100 to 600 nm, but is not limited thereto.

Next, as step 3-4), the step of removing the portion of the insulating film 62 formed on the first conductive semiconductor layer 10 may be performed in order to expose the upper surface (A in FIG. 8(f)) of the first conductive semiconductor layer 10 between the adjacent micro-nanofin LED structures 52 while not removing the insulating film 62 covering the side surfaces of the micro-nanofin LED structures 52. as illustrated in FIG. 8(f). The insulating film 62 may be removed through an appropriate etching method in consideration of the material, and as an example, the insulating film 62 made of SiO$_2$ may be removed through a dry etching such as RIE.

Next, as step 3-5), the step of forming the plurality of micro-nanofin LED structures with the side portion of the first conductive semiconductor layer 10 exposed by further etching the exposed portion (A in FIG. 8(f)) of the first conductive semiconductor layer 10 in the thickness direction is performed, as illustrated in FIG. 8(g). As described above, the exposed portion (B) of the first conductive semiconductor layer 10 is a portion on which side etching is performed in a direction horizontal to the substrate in a step to be described later. The process of further etching the first conductive semiconductor layer 10 in the thickness direction may be performed by, for example, a dry etching method such as ICP.

Thereafter, as step 3-6), the step of side-etching the portion (B of FIG. 8(g)) of the first conductive semiconductor layer with the side surface exposed in a horizontal direction to the substrate may be performed, as illustrated in FIG. 8(i). The side etching may be performed through wet etching. For example, the wet etching may be performed at a temperature of 60 to 100° C. using a tetramethylammonium hydroxide (TMAH) solution.

Thereafter, after wet etching in the lateral direction is performed, as step 3-7), the step of removing the mask pattern layer 61 disposed on the electrode layer 40 and the insulating film 62 covering the side surface may be performed, as illustrated in FIG. 8(j). Both the materials of the mask pattern layer 61 and insulating film 62 disposed on the upper portion may be SiO$_2$, and may be removed through wet etching. For example, the wet etching may be performed using a buffer oxide etchant (BOE).

According to an embodiment of the present invention, as step (5) between steps (3) and (4) described above, the step of forming the protective film 50 on the side surfaces of the plurality of micro-nanofin LED structures may be further performed. The protective film 50 may be formed by, for example, deposition as illustrated in FIG. 8(k), and may have a thickness of 10 to 100 nm, for example 40 nm, and the material may be, for example, alumina. When using alumina, an atomic layer deposition (ALD) method may be used as an example of the deposition. In addition, in order to form the deposited protective film 50 only on the side surfaces of the plurality of micro-nanofin LED structures, the protective film 50 positioned on the remaining portions except for the side surfaces is removed by etching, for example, dry etching such as ICP. On the other hand, it is noted that although FIG. 8(l) illustrates that the protective film 50 surrounds the entire side surfaces, the protective film 50 may not be formed on all or part of the remaining portions except for the photoactive layer on the side surface.

Next, as step (4) according to the present invention, the step of separating the plurality of micro-nanofin LED structures 52 from the substrate may be performed, as illustrated in FIG. 8(m). The separation may be cutting using a cutting mechanism or separation using an adhesive film, and the present invention is not particularly limited thereto.

Also, a method for manufacturing the micro-nanofin LED element 100' in which the polarization inducing layer 40' is formed on the second conductive semiconductor layer 30 will be described with reference to FIG. 9 .

The manufacturing method of the micro-nanofin LED element 100' with the polarization inducing layer 40' is different from the manufacturing method of the micro-nanofin element 100 with the electrode layer 40 only in step (2) in which the polarization inducing layer 40' is formed instead of the electrode layer 40, and all other processes may be performed in the same manner.

Step (2) will be described in detail with reference to FIG. 9, the step of forming the polarization inducing layer 40' on the second conductive semiconductor layer 30 of the LED wafer 51 is performed, as illustrated in FIG. 9(b), and FIGS. 9(c1) and 9(c2). Specifically, the polarization inducing layer 40' may be patterned so that regions having different electrical polarities are adjacent to each other on the second conductive semiconductor layer 30 of the LED wafer 51. More specifically, step (2) includes the steps of 2-1) forming the first polarization inducing layer 41 on the second conductive semiconductor layer 30 (FIG. 9(b)), 2-2) etching the first polarization inducing layer 41 on the second conductive semiconductor layer 30 in the thickness direction along a predetermined pattern (not shown), and 2-3) forming the second polarization inducing layer 42 on the etched intaglio portion (FIGS. 9(*c*1) and 9(*c*2)). Step (2) which is different from the manufacturing method illustrated in FIG. 8 will be described below, and the rest of the description of FIG. 9 replaces with the description of FIG. 8.

The step (2) is the step of forming the polarization inducing layer 40' on the second conductive semiconductor layer 30, and more specifically, the polarization inducing layer 40' may be manufactured through the following subdivided steps.

First, as Step 2-1), the step of forming the first polarization inducing layer 41 on the second conductive semiconductor layer 30 is performed. The first polarization inducing layer 41 may be a typical electrode layer formed on a semiconductor layer, and may be, for example, Cr, Ti, Ni, Au, ITO, etc., preferably ITO in terms of transparency. The first polarization inducing layer 41 may be formed through a typical method of forming an electrode, and may be formed by, for example, deposition through sputtering. For example, when ITO is used, it may be deposited to a thickness of about 150 nm, and may be further subjected to a rapid thermal annealing process after the deposition process. For example, the treatment may be performed at 600° C. for 10 minutes, but since the thickness and material of the first polarization inducing layer 41 may be appropriately adjusted, the present invention is not particularly limited thereto.

Next, as step 2-2), the step of etching the first polarization inducing layer 41 in a thickness direction according to a predetermined pattern is performed. This step is the step of preparing a region at which the second polarization inducing layer 42 to be described later is to be formed, and the pattern may be formed in consideration of the area ratio and arrangement of the first polarization inducing layer 41 and the second polarization inducing layer 42 in the element. For example, the pattern may be formed such that the first polarization inducing layer 41 and the second polarization inducing layer 42 are alternately arranged side by side as illustrated in FIG. 9(*d*). Since the pattern can be formed by appropriately applying a typical photolithography method or nanoimprinting method, a detailed description thereof will be omitted in the present invention.

The etching may be performed by employing an appropriate known etching method in consideration of the selected material of the first polarization inducing layer 41. For example, when the first polarization inducing layer 41 is ITO, it may be etched through wet etching. In this case, the etched thickness may be etched up to the upper surface of the second conductive semiconductor layer 30, that is, all the ITO may be etched in the thickness direction, but is not limited thereto. Specifically, only a portion of the ITO is etched in the thickness direction, and the second polarization inducing layer 42 may be formed on the etched intaglio portion, in this case it is noted that one upper layer of the element may be formed in a two-layer structure in which the first polarization inducing layer 41 of ITO and the second polarization inducing layer 42 are stacked.

Next, as step 2-3), the step of forming the second polarization inducing layer 42 on the etched intaglio portion may be performed (FIGS. 9(*c*1) and 9(*c*2)). The second polarization inducing layer 42 has a material having a different electrical polarity from that of the selected first polarization inducing layer 41, and a material used in a typical LED may be used as for the second polarization inducing layer 42 without limitation. For example, the material may be a metal or a semiconductor, specifically nickel or chromium. As the method for forming these, a known method such as deposition may be appropriately employed according to the material, so that the present invention is not particularly limited thereto.

While the embodiments of the present invention have been described above, the spirit of the present invention is not limited to the embodiment presented herein. One skilled in the art may easily suggest other embodiments due to addition, modification, deletion, inclusion, and the like of components within the same spirit of the present invention, and the addition, modification, deletion, inclusion, and the like of the components fall within the scope and spirit of the present invention.

The invention claimed is:

1. A method for manufacturing a micro-nanofin LED element, comprising the steps of:
    (1) preparing an LED wafer in which a first conductive semiconductor layer, a photoactive layer, and a second conductive semiconductor layer are sequentially stacked;
    (2) forming an electrode layer or a polarization inducing layer patterned so that regions having different electrical polarities are adjacent to each other on the second conductive semiconductor layer of the LED wafer;
    (3) forming a plurality of micro-nanofin LED structures by etching the LED wafer in a thickness direction so that each element has a plane having a length and width of nano or micro size in which a thickness perpendicular to the plane is smaller than the length; and
    (4) separating the plurality of micro-nanofin LED structures from the LED wafer.

2. The method according to claim 1, wherein the polarization inducing layer in the step (2) is formed by including the steps of:
    2-1) forming a first polarization inducing layer on the second conductive semiconductor layer;
    2-2) etching the first polarization inducing layer in the thickness direction along a predetermined pattern; and
    2-3) forming a second polarization inducing layer on an etched intaglio portion.

3. The method according to claim 1, wherein the step (3) includes the steps of:
    3-1) forming a mask pattern layer on an upper surface of the electrode layer or the polarization inducing layer so that each element has a planar shape having a length and width of nano or micro size;
    3-2) forming the plurality of micro-nanofin LED structures by etching the first conductive semiconductor layer to a partial thickness in the thickness direction along a pattern of the mask pattern layer;
    3-3) forming an insulating film to cover an exposed side surface of each of the plurality of micro-nanofin LED structures;
    3-4) removing a portion of the insulting film formed on the upper portion of the first conductive semiconductor layer to expose an upper surface of the first conductive semiconductor layer between the adjacent micro-nanofin LED structures while not removing the insulating film covering side surfaces of the plurality of micro-nanofin LED structures;
    3-5) forming the plurality of micro-nanofin LED structures in which a side portion of the first conductive semiconductor layer is exposed by further etching an exposed upper portion of the first conductive semiconductor layer in the thickness direction;

3-6) etching the first conductive semiconductor layer exposed in each of the micro-nanofin LED structures from both side surfaces in a width direction to a center; and 3-7) removing the mask pattern layer disposed on the upper portion of the electrode layer or the polarization inducing layer and the insulating film covering the side surface.

4. The method according to claim 1, further comprising, between the steps (3) and (4), the step of (5) forming a protective film on the side surfaces of the plurality of micro-nanofin LED structures.

5. The method according to claim 1, wherein a lower surface of the first conductive semiconductor layer of the micro-nanofin LED element separated in the step (4) has a protrusion having a predetermined width and thickness formed in a longitudinal direction of the element.

6. A micro-nanofin LED element which is a rod-type element having a plane having a length and width of nano or micro size in which a thickness perpendicular to the plan is smaller than the length, and in which a first conductive semiconductor layer, a photoactive layer, a second conductive semiconductor layer, and an electrode layer or a polarization inducing layer are sequentially stacked in a thickness direction, wherein one of the first conductive semiconductor layer and the second conductive semiconductor layer includes a p-type GaN semiconductor layer, and the other includes an n-type GaN semiconductor layer, and the p-type GaN semiconductor layer has a thickness of 10 to 350 nm, and the n-type GaN semiconductor layer has a thickness of 1000 to 3000 nm, and a thickness of the photoactive layer has a thickness of 30 to 200 nm.

7. The micro-nanofin LED element according to claim 6, wherein the polarization inducing layer is configured so that electrical polarities of both ends of the element in a longitudinal direction are different from each other.

8. The micro-nanofin LED element according to claim 6, wherein the length is 1000 to 10000 nm, and the thickness is 100 to 3000 nm.

9. The micro-nanofin LED element according to claim 6, wherein a ratio of the length and thickness of the element is 3:1 or more.

10. The micro-nanofin LED element according to claim 6, wherein the polarization inducing layer includes a first polarization inducing layer and a second polarization inducing layer that are disposed adjacent to each other in a longitudinal direction of the element and have different electrical polarities from each other.

11. The micro-nanofin LED element according to claim 10, wherein the first polarization inducing layer is ITO, and the second polarization inducing layer is a metal or semiconductor.

12. The micro-nanofin LED element according to claim 6, wherein an emission area of the micro-nanofin LED element exceeds twice an area of a vertical cross-section of the micro-nanofin LED element.

13. The micro-nanofin LED element according to claim 6, wherein the micro-nanofin LED element is for use in an electric field array assembly in which the LED element is self-aligned on an electrode through an electric field induction arrangement.

14. The micro-nanofin LED element according to claim 6, wherein a lower surface of the first conductive semiconductor layer of the micro-nanofin LED element has a protrusion having a predetermined width and thickness formed in a longitudinal direction of the element.

15. The micro-nanofin LED element according to claim 14, wherein a width of the protrusion is formed to be 50% or less compared to the width of the micro-nanofin LED element.

* * * * *

UNITED STATES PATENT AND TRADEMARK OFFICE
CERTIFICATE OF CORRECTION

| | | |
|---|---|---|
| PATENT NO. | : 12,439,739 B2 | Page 1 of 1 |
| APPLICATION NO. | : 17/997265 | |
| DATED | : October 7, 2025 | |
| INVENTOR(S) | : Young Rag Do | |

It is certified that error appears in the above-identified patent and that said Letters Patent is hereby corrected as shown below:

In the Claims

<u>Claim 6, Column 17, Line 20:</u>
Replace "perpendicular to the plan" with -- perpendicular to the plane --.

Signed and Sealed this
Ninth Day of December, 2025

John A. Squires
*Director of the United States Patent and Trademark Office*